(12) United States Patent
Hatai

(10) Patent No.: US 8,670,237 B2
(45) Date of Patent: Mar. 11, 2014

(54) POWER CONVERSION APPARATUS

(75) Inventor: Akira Hatai, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/990,566

(22) PCT Filed: Dec. 28, 2010

(86) PCT No.: PCT/JP2010/073738
§ 371 (c)(1),
(2), (4) Date: May 30, 2013

(87) PCT Pub. No.: WO2012/090307
PCT Pub. Date: Jul. 5, 2012

(65) Prior Publication Data
US 2013/0258602 A1   Oct. 3, 2013

(51) Int. Cl.
*H05K 7/20* (2006.01)
(52) U.S. Cl.
USPC ........... 361/715; 361/690; 361/702; 361/703; 361/704; 165/80.3
(58) Field of Classification Search
None
See application file for complete search history.

(56) References Cited

U.S. PATENT DOCUMENTS

| | | | | |
|---|---|---|---|---|
| 6,144,556 A * | 11/2000 | Lanclos | | 361/695 |
| 6,411,514 B1 * | 6/2002 | Hussaini | | 361/704 |
| 7,274,569 B2 * | 9/2007 | Sonoda | | 361/714 |
| 7,515,422 B2 * | 4/2009 | Hirota et al. | | 361/709 |
| 7,646,606 B2 * | 1/2010 | Rytka et al. | | 361/704 |
| 7,907,408 B2 * | 3/2011 | Ippoushi et al. | | 361/700 |
| 8,541,875 B2 * | 9/2013 | Bennion et al. | | 257/706 |
| 2005/0128710 A1 * | 6/2005 | Beitelmal et al. | | 361/709 |
| 2006/0044762 A1 * | 3/2006 | Kikuchi et al. | | 361/704 |
| 2008/0130232 A1 | 6/2008 | Yamamoto et al. | | |
| 2010/0079956 A1 | 4/2010 | Ibori et al. | | |

FOREIGN PATENT DOCUMENTS

| | | |
|---|---|---|
| GB | 2 353 418 A | 2/2001 |
| JP | 2002-315114 A | 10/2002 |
| JP | 2006-196494 A | 7/2006 |
| JP | 2007-181316 A | 7/2007 |
| JP | 2008-86101 A | 4/2008 |
| JP | 2008-140803 A | 6/2008 |
| JP | 2010-104217 A | 5/2010 |
| JP | 2010-165914 A | 7/2010 |
| WO | 00/51228 A1 | 8/2000 |

OTHER PUBLICATIONS

International Search Report for PCT/JP2010/073738 dated Mar. 8, 2011.

* cited by examiner

*Primary Examiner* — Boris Chervinsky
(74) *Attorney, Agent, or Firm* — Sughrue Mion, PLLC

(57) ABSTRACT

In a power conversion apparatus including a rectifying module mounted with a power conversion device, an inverter module, and a direct-current reactor, a rectifying module and an inverter module 5B are mounted on a base section of a cooling fin, a direct-current reactor (DCL) is arranged in a lower layer of a vane section attached to the lower surface of the base section of the cooling fin 3A, an air gap section is provided in the cooling fin 3A, and a terminal block for obtaining electrical connection between the rectifying module and the inverter module and the direct-current reactor (DCL) is arranged making use of a space of the air gap section.

20 Claims, 13 Drawing Sheets

(a)  (b)

(a)　　　　　　　　　　　　(b)

POWER CONVERSION APPARATUS

CROSS REFERENCE TO RELATED APPLICATIONS

This application is a National Stage of International Application No. PCT/2010/073738 filed Dec. 28, 2010, the contents of which are incorporated herein by reference in their entirety.

FIELD

The present invention relates to a power conversion apparatus mounted with a direct-current reactor.

BACKGROUND

When a direct-current reactor (hereinafter referred to as "DCL") is mounted on a power conversion apparatus, an ability for suppressing a high-frequency component increases and environmental performance of a product can be improved. Therefore, there is a product in which the DCL is mounted on the power conversion apparatus.

As the power conversion apparatus mounted with the DCL, for example, there is a power conversion apparatus disclosed in Patent Literature 1. Patent Literature 1 discloses an inverter apparatus including an inverter apparatus main body incorporating an electronic circuit, a main body case surrounding the inverter apparatus main body, and a terminal section provided at one end of the inside of the main body case. The inverter apparatus has a configuration in which a reactor housing body including a terminal protection cover is detachably attached to one end on the terminal section side of the main body case and a direct-current reactor electrically connected to the terminal section is arranged in the reactor housing body. The Patent Literature 1 considers arranging a reactor cooling fan and a heat sink in the reactor housing body according to necessity.

CITATION LIST

Patent Literature

Patent Literature 1: Japanese Patent Application Laid-open No. 2007-181316

SUMMARY

Technical Problem

However, in general, winding temperature of the DCL sometimes rises to temperature equal to or higher than 100° C. according to an increase in the mounting area and the volume of the DCL. Therefore, when the DCL is mounted on the power conversion apparatus, the DCL is a factor of increasing the setting area and the internal temperature of the apparatus.

Patent Literature 1 also considers arranging the reactor cooling fan and the heat sink in the reactor housing body. However, it is necessary to separately secure a space for reactor mounting. Therefore, an increase in the size of the apparatus is inevitable.

In the configuration disclosed in Patent Literature 1, it is necessary to separately manufacture a case that houses the reactor. Therefore, there is a problem in that the apparatus is increased in size and costs.

Further, for example, when a power conversion apparatus not mounted with a DCL is replaced with a power conversion apparatus mounted with a DCL, customers often demand that the setting area of the power conversion apparatus should be the same as or similar to the setting area of the conventional power conversion apparatus. It is desired to reduce the mounting area of the power conversion apparatus mounted with the DCL to be as small as the mounting area of the power conversion apparatus not mounted with the DCL.

The present invention has been devised in view of the above and it is an object of the present invention to provide a power conversion apparatus that can suppress an increase in a mounting area and costs even if a DCL is mounted on the power conversion apparatus.

Solution to Problem

In order to solve the aforementioned problems, a power conversion apparatus according to one aspect of the present invention is configured to include: a power conversion module mounted with a power conversion device; a direct-current reactor; and a cooling fin configured to cool the power conversion module, wherein the power conversion module is mounted on a base section of the cooling fin, the direct-current reactor is arranged in a lower layer of a vane section attached to a lower surface of the base section of the cooling fin, and an air gap section is provided in the cooling fin, and a terminal block for obtaining electrical connection between the power conversion module and the direct-current reactor is arranged making use of a space of the air gap section.

Advantageous Effects of Invention

According to the present invention, there is an effect that it is possible to suppress an increase in a mounting area and costs even if a DCL is mounted on the power conversion apparatus.

DESCRIPTION OF EMBODIMENTS

Power conversion apparatuses according to embodiments of the present invention are explained below with reference to the accompanying drawings. The present invention is not limited by the embodiments.

First Embodiment

Figure 1:
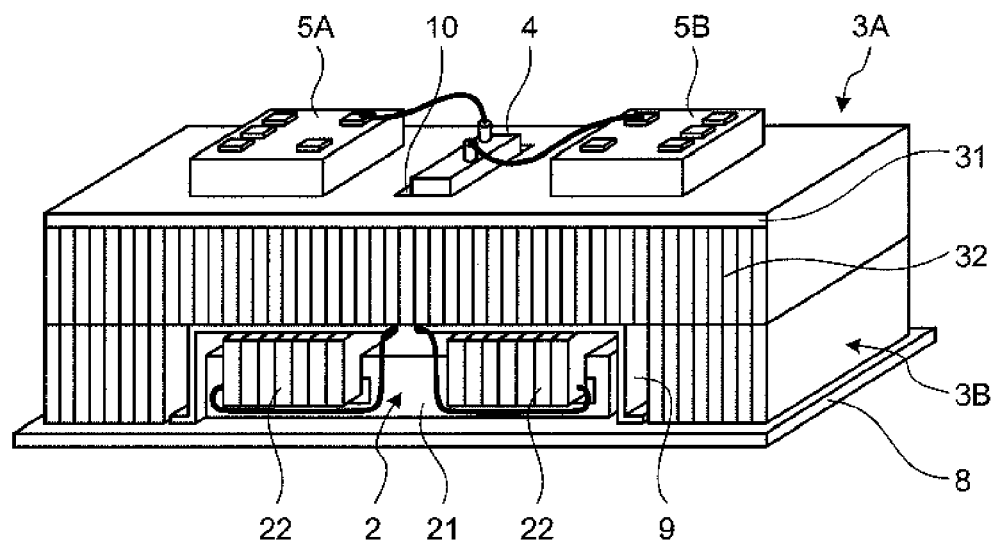
FIG. 1 is a perspective view of a configuration example of a power conversion apparatus according to a first embodiment.
Figure 2:
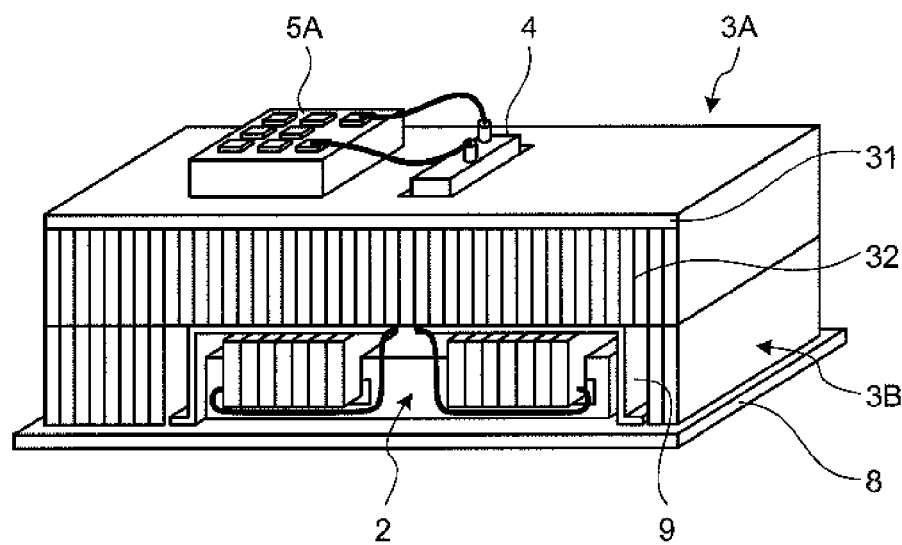
FIG. 2 is a perspective view of another configuration example of the power conversion apparatus according to the first embodiment.
Figure 3:
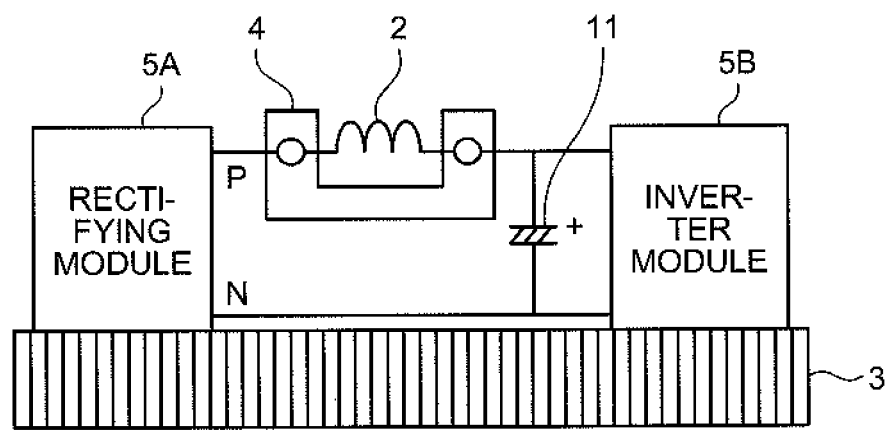
FIG. 3 is a schematic diagram of an electrical connection configuration among a DCL, a rectifying module, and an inverter module.
Figure 4:
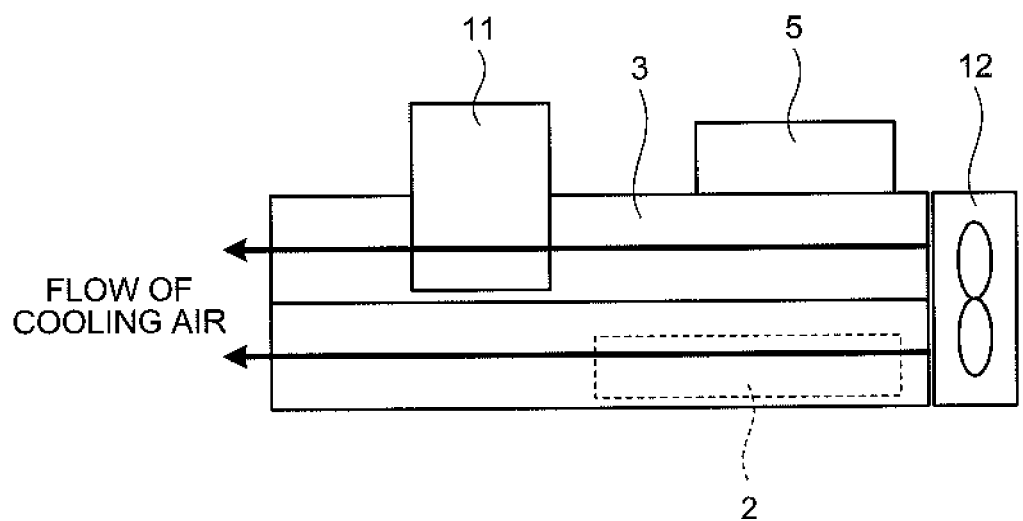
FIG. 4 is a schematic diagram of a flow of cooling air that flows when a cooling fan is provided.
Figure 5:
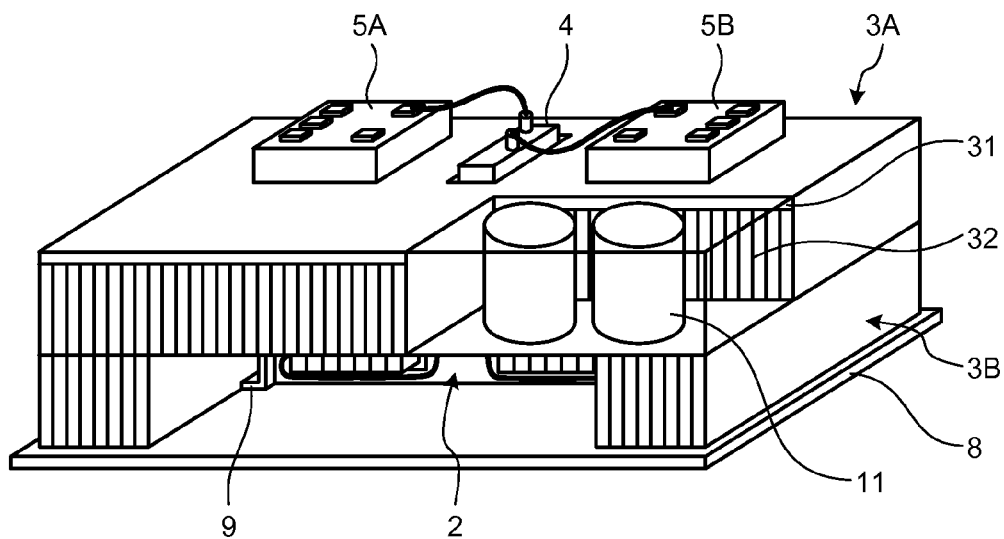
FIG. 5 is a diagram of an example of a mounting position of a main circuit capacitor in the power conversion apparatus according to the first embodiment.

The configuration of a power conversion apparatus according to a first embodiment is explained with reference to FIGS. 1 to 5. FIG. 1 is a perspective view of a configuration example of a power conversion apparatus according to the first embodiment. FIG. 2 is a perspective view of another configuration example of the power conversion apparatus according to the first embodiment. FIG. 3 is a schematic diagram of an electrical connection configuration among a DCL, a rectifying module, and an inverter module. FIG. 4 is a schematic diagram of a flow of cooling air that flows when a cooling fan is provided. FIG. 5 is a diagram of an example of a mounting position of a main circuit capacitor in the power conversion apparatus according to the first embodiment.

The power conversion apparatus according to the first embodiment includes, as main circuit sections having a power conversion function, a DCL 2, a rectifying module 5A, an inverter module 5B, and a main circuit capacitor 11 (see FIGS. 3 and 5). A terminal block 4 is provided as a member for electrically connecting the circuit sections as shown in FIG. 3. The power conversion apparatus includes, as members for holding the circuit sections or suppressing a temperature rise of the rectifying module 5A and the inverter module 5B, a cooling fin 3A, cooling fins 3B, a bottom plate 8, and a DCL fixing member 9. The rectifying module 5A may be a converter module having a power conversion function.

The cooling fin 3A includes a base section 31 functioning as a bottom surface and a vane section 32 including a group of metal plates integrally provided in parallel with a predetermined space from one another on the lower surface of the base section 31. On the upper surface of the base section 31, the rectifying module 5A that rectifies electric power from a not-shown alternating-current power supply and an inverter module 5B that converts an output (direct-current power) of the rectifying module 5A into desired alternating-current power are mounted. The vane section 32 is provided on the lower surface of the base section 31. The DCL 2 formed thin and flat is arranged in the lower layer of the vane section 32. The DCL 2 includes a DCL core 21 and a winding section 22 wound around the DCL core 21. The DCL 2 is connected in series between the rectifying module 5A and the inverter module 5B. According to these configurations, the power conversion apparatus according to the first embodiment is arranged in a hierarchical configuration in which, from the upper surface (the upper layer) to the lower surface (the lower layer), a power conversion module (the rectifying module 5A and the inverter module 5B), a cooling fin (the base section and the vane section), and the DCL are respectively arranged in order in a first layer, a second layer, and a third layer.

In lower parts of the cooling fin 3A (upper parts of the bottom plate 8) at the left and right ends of the DCL 2, the cooling fins 3B including vane sections same as the vane section of the cooling fin 3A are provided. The cooling fins 3B can be integrally formed with the cooling fin 3A.

An air gap section 10 is provided substantially in the center of the cooling fin 3A. In the air gap section 10, the terminal block 4 for connecting the DCL 2 in series between the modules is provided. Instead of the terminal block 4, a material having electrical conductivity such as a flat type copper wire can be formed to be insertable into the air gap section of the cooling fin 3A to connect the modules and the DCL 2.

The DCL fixing member 9 is provided on the bottom plate 8 provided in the bottom layer of the power conversion apparatus. The DCL fixing member 9 fixes the DCL 2 to cover an upper part of the DCL 2 and at least a part of a peripheral section. The DCL fixing member 9 is made of a nonmagnetic material to prevent a magnetic flux passing through the DCL core 21 from flowing into the DCL fixing member 9. For the fixing of the DCL 2 by the DCL fixing member 9, any method can be used as long as the DCL 2 can be fixed. For example, it is conceivable to inject resin or the like excellent in thermal conductivity into a space between the winding section 22 and the DCL fixing member 9 and bring the DCL fixing member 9 and the cooling fin into contact with each other to fix the DCL fixing member 9 and the cooling fin. The cooling fin brought into contact with the DCL fixing member 9 can be the cooling fin 3A arranged on the upper surface of the DCL or can be cooling fins 3B arranged on the left and right of the DCL 2.

The rectifying module 5A and the inverter module 5B can be respectively housed in separate cases or can be housed in the same case. For example, in the case of a model having a large capacity, the rectifying module 5A and the inverter module 5B are often housed in separate cases and are configured, for example, as shown in FIG. 1. On the other hand, in the case of a model having a small capacity, the rectifying module 5A and the inverter module 5B can be housed in the same case and are configured, for example, as shown in FIG. 2.

In the power conversion apparatus according to the first embodiment, the rectifying module 5A and the inverter module 5B, the cooling fin 3A (the cooling fins 3B), and the DCL 2 are hierarchically arranged in the vertical direction from the upper surface to the lower surface. Therefore, it is possible to mount the DCL 2 without increasing a mounting area. Because the DCL 2 can be formed in thin and flat, it is possible to reduce an increase in the dimension in the height direction as much as possible.

In the power conversion apparatus according to the first embodiment, the cooling fin 3A (the cooling fins 3B) is arranged between the rectifying module 5A and the inverter module 5B and the DCL 2. Therefore, for example, as shown in FIG. 4, by blowing the air of a cooling fan 12 from the horizontal direction, it is possible to lower the temperature of both of the main circuit capacitor 11 present on the downstream side of the power conversion module 5 (the rectifying module 5A and the inverter module 5B) and the DCL 2 arranged further on the lower layer side than the main circuit capacitor 11. In particular, because the DCL 2 and the power conversion module 5 are separated by the DCL fixing member 9, there is an advantage that the temperatures of the DCL 2 and the power conversion module 5 do not affect each other.

In the power conversion apparatus according to the first embodiment, because the DCL 2 is incorporated in the power conversion apparatus, it is possible to reduce a ripple component of a main circuit current and use a small main circuit capacitor having small ripple tolerance. Therefore, it is possible reduce a mounting space for the main circuit capacitor 11. For example, as shown in FIG. 5, it is possible to arrange the main circuit capacitor 11 in a space in the upper surface section of the DCL 2. In FIG. 5, the main circuit capacitor 11 is arranged on the inverter module 5B side. However, it is naturally possible to arrange the main circuit capacitor 11 on the rectifying module 5A side.

As explained above, in the power conversion apparatus according to the first embodiment, the power conversion module mounted with the power conversion device is mounted on the base section of the cooling fin, the DCL is arranged in the lower layer of the vane section attached to the lower surface of the base section of the cooling fin, and the terminal block for obtaining electrical connection between the power conversion module and the DCL is arranged making use of the space of the air gap section provided in the cooling fin. Therefore, even when the DCL is mounted on the power conversion apparatus, it is possible to suppress an increase in a mounting area and costs.

Second Embodiment

Figure 6:
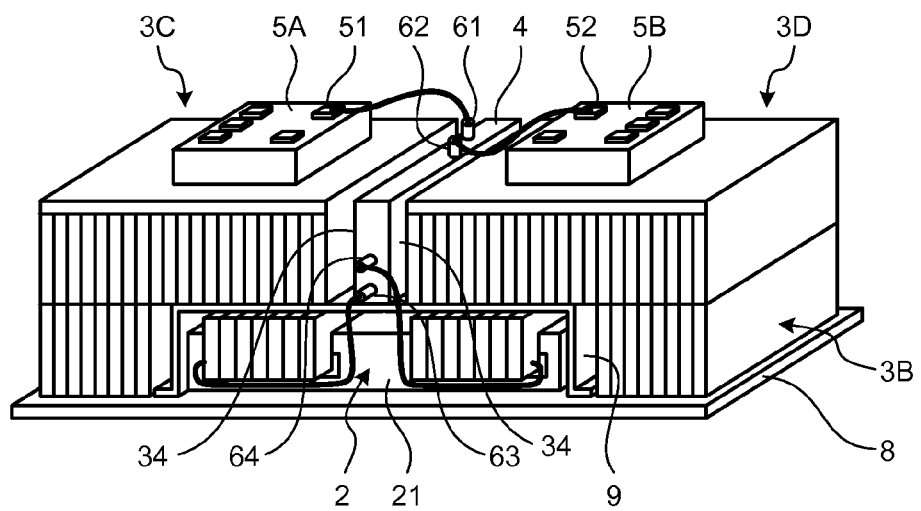
FIG. 6 is a perspective view of a configuration example of a power conversion apparatus according to a second embodiment.
Figure 7:
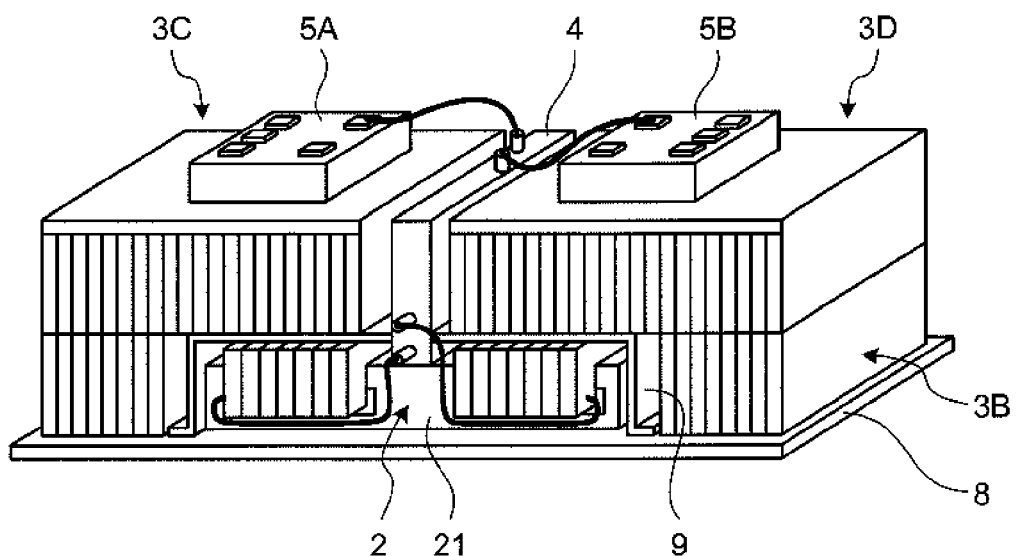
FIG. 7 is a perspective view of another configuration example of a terminal block in the configuration shown in FIG. 6.
Figure 8:
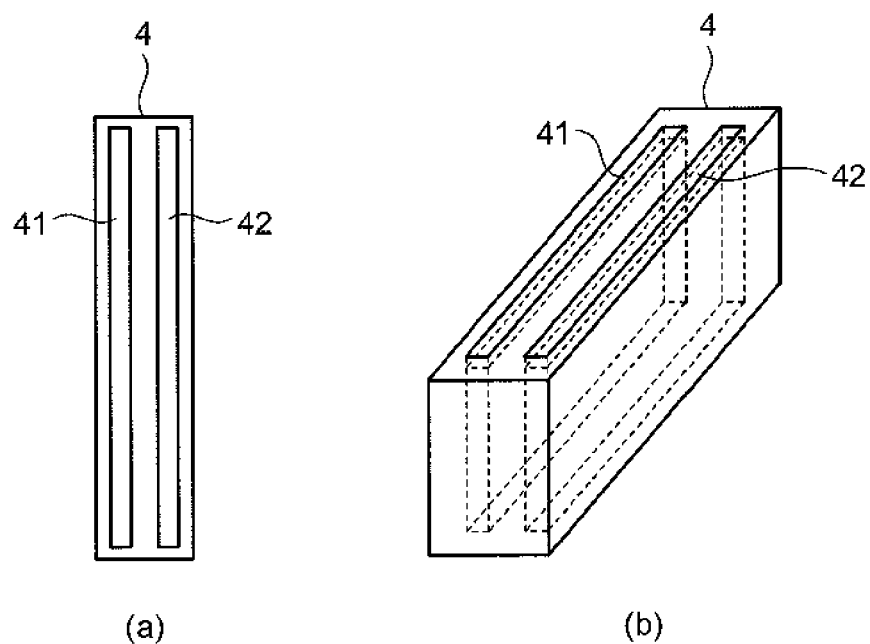
FIG. 8 is a top view and a perspective view of the configuration of the terminal block in the configuration shown in FIGS. 6 and 7.
Figure 9:
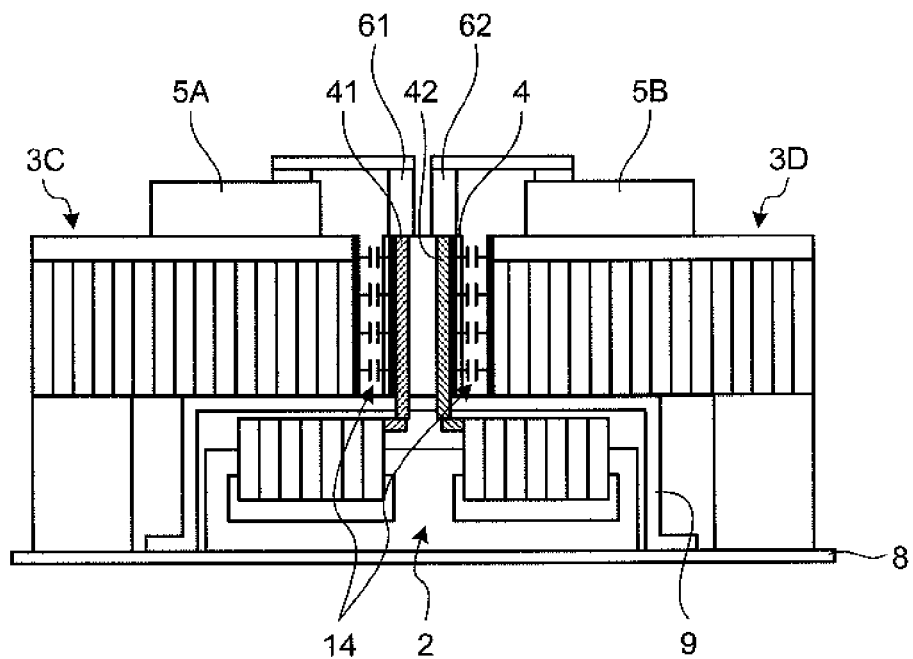
FIG. 9 is a front view including a partial sectional view of a forming position of stray capacitance in the configuration shown in FIG. 6.
Figure 10:
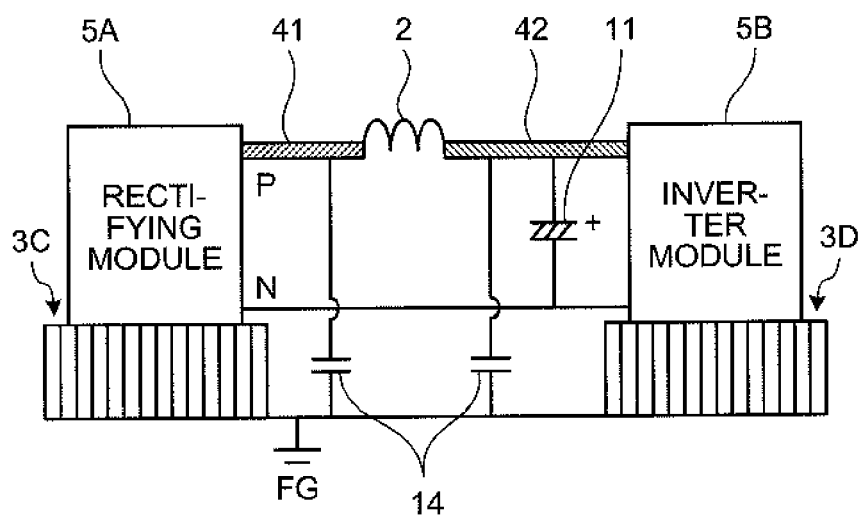
FIG. 10 is a diagram of the forming position of the stray capacitance shown on an equivalent circuit in the configuration shown in FIGS. 6 and 7.
Figure 11:
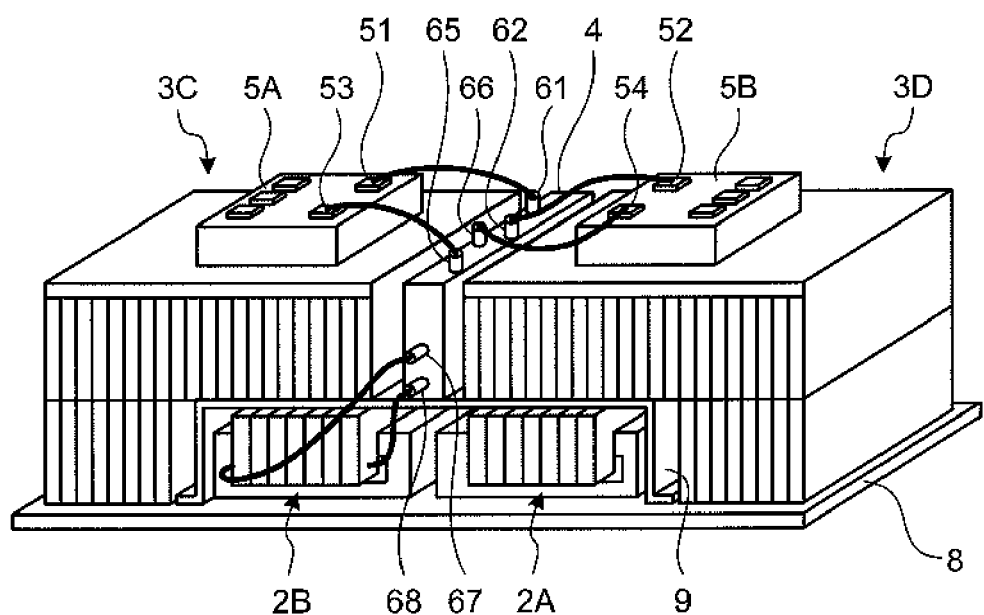
FIG. 11 is a perspective view of another configuration example of the power conversion apparatus according to the second embodiment.
Figure 12:
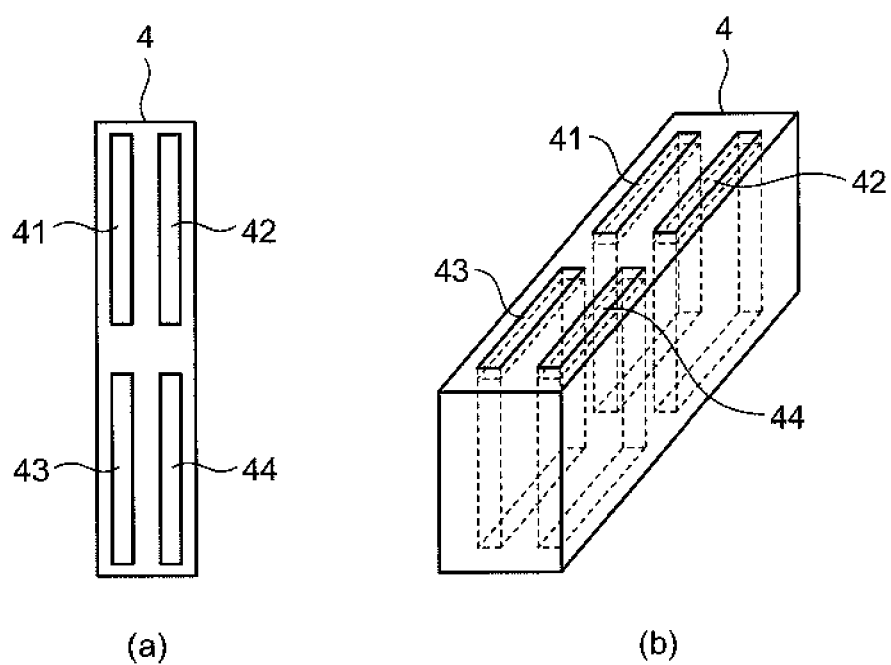
FIG. 12 is a top view and a perspective view of the configuration of a terminal block in the configuration shown in FIG. 11.
Figure 13:
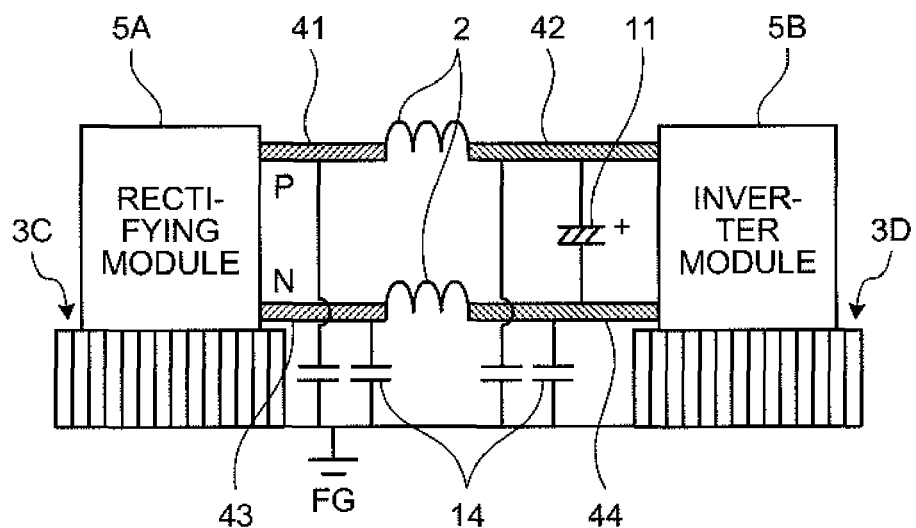
FIG. 13 is a diagram of a forming position of the stray capacitance shown on the equivalent circuit in the configuration shown in FIG. 11.

In the first embodiment, the embodiment in which the rectifying module and the inverter module are mounted on the base section of the common cooling fin is explained. A second embodiment is an embodiment in which a rectifying module and an inverter module are mounted on base sections of separate cooling fins. The embodiment is explained with reference to FIGS. 6 to 13. FIG. 6 is a perspective view of a configuration example of a power conversion apparatus according to the second embodiment. FIG. 7 is a perspective view of another configuration example of a terminal block in the configuration shown in FIG. 6. FIG. 8 is a top view (FIG. 8(*a*)) and a perspective view (FIG. 8(*b*)) of the configuration of the terminal block in the configuration shown in FIGS. 6 and 7. FIG. 9 is a front view including a partial sectional view of a forming position of stray capacitance in the configuration shown in FIG. 6. FIG. 10 is a diagram of the forming position of the stray capacitance shown on an equivalent circuit in the configuration shown in FIGS. 6 and 7. FIG. 11 is a perspective view of another configuration example of the power conversion apparatus according to the second embodiment. FIG. 12 is a top view (FIG. 12(*a*)) and a perspective view (FIG. 12(*b*)) of the configuration of the terminal block in the configuration shown in FIG. 11. FIG. 13 is a diagram of a forming position of the stray capacitance shown on the equivalent circuit in the configuration shown in FIG. 11.

In the power conversion apparatus according to the second embodiment, as shown in FIG. 6, a cooling fin 3C (a first cooling fin) and a cooling fin 3D (a second cooling fin) separate from each other are provided as cooling fins corresponding to the cooling fin 3A shown in FIG. 1. The rectifying module 5A is mounted on the cooling fin 3C side. The inverter module 5B is mounted on the cooling fin 3D side. A space is necessarily formed between the cooling fins 3C and 3D. The terminal block 4 is arranged in the space. As shown in FIG. 6, the terminal block 4 can be arranged in an upper part of the DCL fixing member 9. Alternatively, as shown in FIG. 7, an air gap can be provided in the DCL fixing member 9 and the terminal block 4 can be set on an upper part of the DCL core 21. The DCL 2 is arranged in a lower layer of the cooling fin 3C and the cooling fin 3D because of a reason same as the reason in the first embodiment.

As shown in FIG. 8, a P-side input conductor (a first positive-side connection conductor) 41 and a P-side output conductor (a second positive-side connection conductor) 42 connected to a high-voltage side terminal of a power conversion module are housed in the inside of the terminal block 4. The P-side input conductor 41 is a connection conductor for obtaining electrical connection between a P-side terminal 51 of the rectifying module 5A and the DCL 2. As shown in FIG. 6, the P-side terminal 51 and the DCL 2 are electrically connected via a terminal 61 provided on an upper part side of the terminal block 4 and a terminal 63 provided on a side-part side of the terminal block 4. Similarly, the P-side output conductor 42 is a connection conductor for obtaining electrical connection between a P-side terminal 52 of the inverter module 5B and the DCL 2. The P-side terminal 52 and the DCL 2 are electrically connected via a terminal 62 provided on the upper-part side of the terminal block 4 and a terminal 64 provided on the side-part side of the terminal block 4.

As shown in FIG. 9, the P-side input conductor 41 and the P-side output conductor 42 are desirably formed in a shape in which the P-side input conductor 41 and the P-side output conductor 42 are opposed to, in an equal surface area, side surface sections 34 of the cooling fins 3C and 3D adjacent thereto. The sectional area of the P-side input conductor 41 and the P-side output conductor 42 only has to be designed according to the volume of a flowing current. According to these configurations, stray capacitance 14 is formed between the P-side input conductor 41 and the P-side output conductor 42 and the side surface sections 34. If the cooling fins 3C and 3D are connected to a GND terminal (FG) of the power conversion apparatus, an equivalent circuit shown in FIG. 10 is configured.

The configuration shown in FIGS. 6 and 7 is a form in which the DCL 2 is connected to only the P-side terminals of the rectifying module 5A and the inverter module 5B. As shown in the diagram of FIG. 11, the DCL 2 can be configured to be connected to both of the P-side terminals and N-side terminals of the rectifying module 5A and the inverter module 5B. In the case of this configuration, for example, the terminal block 4 shown in FIG. 12 is used.

In FIG. 12, in addition to the P-side input conductor 41 and the P-side output conductor 42, an N-side (negative-side) input conductor 43 and an N-side (negative-side) output conductor 44 connected to a low-voltage side terminal of the power conversion module are housed in the inside of the terminal block 4. The N-side input conductor 43 is a connection conductor for obtaining electrical connection between a N-side terminal 53 of the rectifying module 5A and a DCL (a DCL 2B) on one side (an N side) of DCLs. As shown in FIG. 11, the N-side input conductor 43 electrically connects the N-side terminal 53 and one end of the DCL 2B via a terminal 65 provided on the upper-part side of the terminal block 4 and a terminal 67 provided on the side-part side of the terminal block 4. Similarly, the N-side output conductor 44 is a connection conductor for obtaining electrical connection between the N-side terminal of the inverter module 5B and the DCL 2B. The N-side output conductor 44 electrically connects an N-side terminal 54 and the other end of the DCL 2B via a terminal 66 provided on the upper-part side of the terminal block 4 and a terminal 68 provided on the side-part side of the terminal block 4. As electrical connection between the P-side terminals 51 and 52 and a DCL (a DCL 2A) on the other side (a P side) of the DCLs, connection same as the connection on the front side is adopted on a not-shown rear side. According to these configurations, the stray capacitance 14 is formed between the P-side input conductor 41, the P-side output conductor 42, the N-side input conductor 43, and the N-side output conductor 44 and side surface sections of the cooling fin 3C or the cooling fin 3D adjacent thereto. If the cooling fins 3C and 3D are connected to a GND terminal (FG) of the power conversion apparatus, an equivalent circuit shown in FIG. 13 is configured.

As explained above, in the power conversion apparatus according to the second embodiment, the DCLs are incorporated in the power conversion apparatus. Therefore, it is possible to reduce higher harmonics and also reduce high-frequency noise using a noise filter formed by the DCL and the stray capacitance. Further, it is possible to increase a reducing effect of higher harmonics and high-frequency noise using noise filters formed by the DCLs and the stray capacitance on both the P side and the N side of a rectified output.

In FIG. 12, dielectrics can be inserted into both of a place where the P-side input conductor 41 and the N-side input conductor 43 are close to each other and a place where the P-side output conductor 42 and the N-side output conductor 44 are close to each other. If the power conversion apparatus is configured in this way, it is possible to form stray capacitance different from the stray capacitance explained above between the respective conductors. Therefore, it is possible to use the stray capacitance as snubber capacitors.

Third Embodiment

Figure 14:
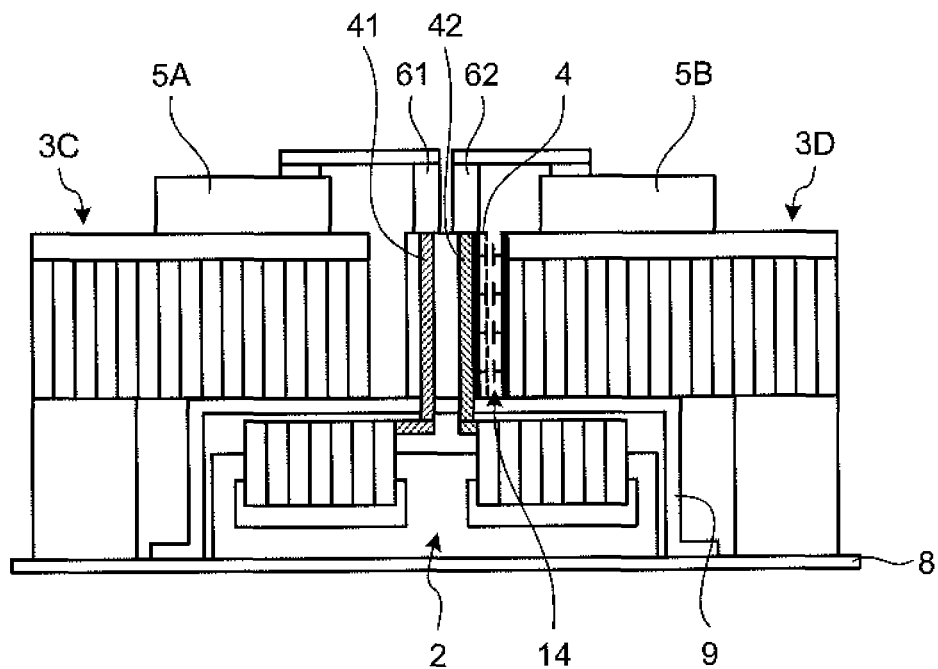
FIG. 14 is a front view including a partial sectional view of a forming position of stray capacitance in a third embodiment.
Figure 15:
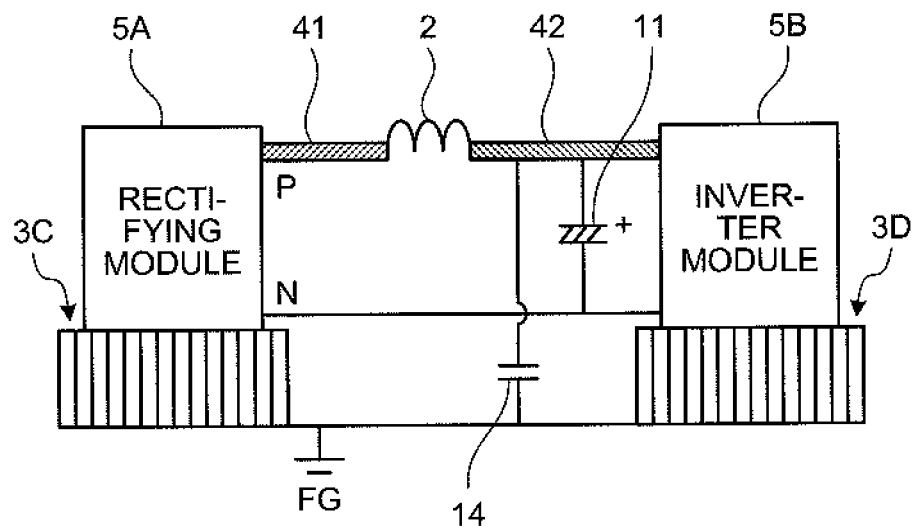
FIG. 15 is a diagram of a forming position of the stray capacitance shown on an equivalent circuit in a configuration shown in FIG. 14.
Figure 16:
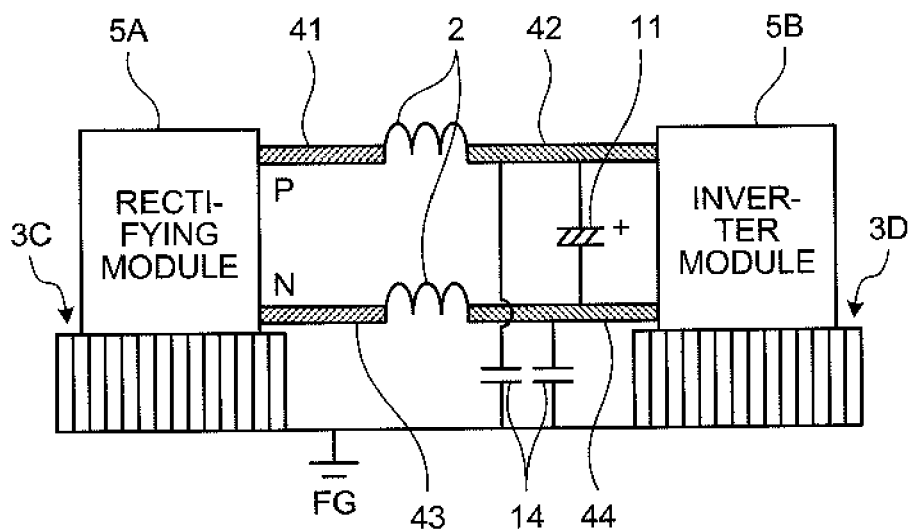
FIG. 16 is a diagram of another forming position of the stray capacitance shown on the equivalent circuit in the third embodiment.

In the second embodiment, the embodiment in which the stray capacitance is formed between the conductors on the inside of the terminal block and the cooling fins of the rectifying module and the inverter module is explained. A third embodiment is an embodiment in which stray capacitance between conductors and a cooling fin of an inverter module is set larger than stray capacitance between the conductors and a cooling fin of a rectifying module. This embodiment is explained with reference to FIGS. 14 to 16. FIG. 14 is a front view including a partial sectional view of a forming position of the stray capacitance in the third embodiment. FIG. 15 is a diagram of a forming position of the stray capacitance shown on an equivalent circuit in a configuration shown in FIG. 14. FIG. 16 is a diagram of another forming position of the stray capacitance shown on the equivalent circuit.

In the power conversion apparatus according to the second embodiment, as shown in FIG. 9, the terminal block 4 is arranged in a position at substantially equal distances from the cooling fins 3C and 3D. In the third embodiment, as shown in FIG. 14, the terminal block 4 is arranged such that the distance to the cooling fin 3D side is smaller than the distance to the cooling fin 3C side. With this configuration, the stray capacitance 14 formed between the P-side output conductor 42 and the side surface section of the cooling fin 3D increases and an equivalent circuit shown in FIG. 15 is formed. Stray capacitance is formed between the P-side input conductor 41 and the side surface section of the cooling fin 3C as well. However, a capacitance value of the stray capacitance is smaller than a capacitance value of the stray capacitance 14 formed between the P-side output conductor 42 and the side surface section of the cooling fin 3D and can be neglected in terms of a circuit. Therefore, the stray capacitance is not shown on the equivalent circuit shown in FIG. 15.

In the second embodiment, it is explained that higher harmonics and high-frequency noise are reduced by the noise filters formed by the DCLs and the stray capacitance. However, when a capacitance value is present on an input side of the DCLs (the rectifying module side), a filter characteristic is sometimes deteriorated. For example, when higher harmonics or high-frequency noise on the rectifying module side is about to be transmitted from the inverter module side, noise components of the higher harmonics or the high-frequency noise are blocked by inductance components of the DCLs and discharged to the FG by the stray capacitance on an output side of the DCLs (the inverter module side). On the other hand, when the stray capacitance is formed on the input side of the DCLs (the rectifying module side), impedance on the input side viewed from the output side is reduced by a capacitance value of the stray capacitance and a frequency component desired to be blocked. Therefore, the filter characteristic is sometimes deteriorated. Assuming such a case, in the third embodiment, the arrangement of the terminal block 4 is contrived such that the stray capacitance on the output side of the DCLs is larger than the stray capacitance on the input side of the DCLs (i.e., the stray capacitance on the output side of the DCLs is predominant).

As explained above, in the third embodiment, the power conversion apparatus is configured such that the stray capacitance on the output side of the DCLs is predominant. Therefore, it is possible to prevent a situation in which the filter characteristic is deteriorated at a specific frequency component. It is possible to establish a satisfactory filter characteristic over all bands of higher harmonics and high-frequency noise.

In FIG. 15, the configuration in which the stray capacitance 14 is formed between the P-side output conductor 42 and the side surface section of the cooling fin 3D is shown. However, the stray capacitance can be formed on both the P side and the N side of a rectified output. In this case, as shown in an equivalent circuit in FIG. 16, the stray capacitance is formed between the N-side output conductor 44 and the cooling fin 3D as well.

Fourth Embodiment

Figure 17:
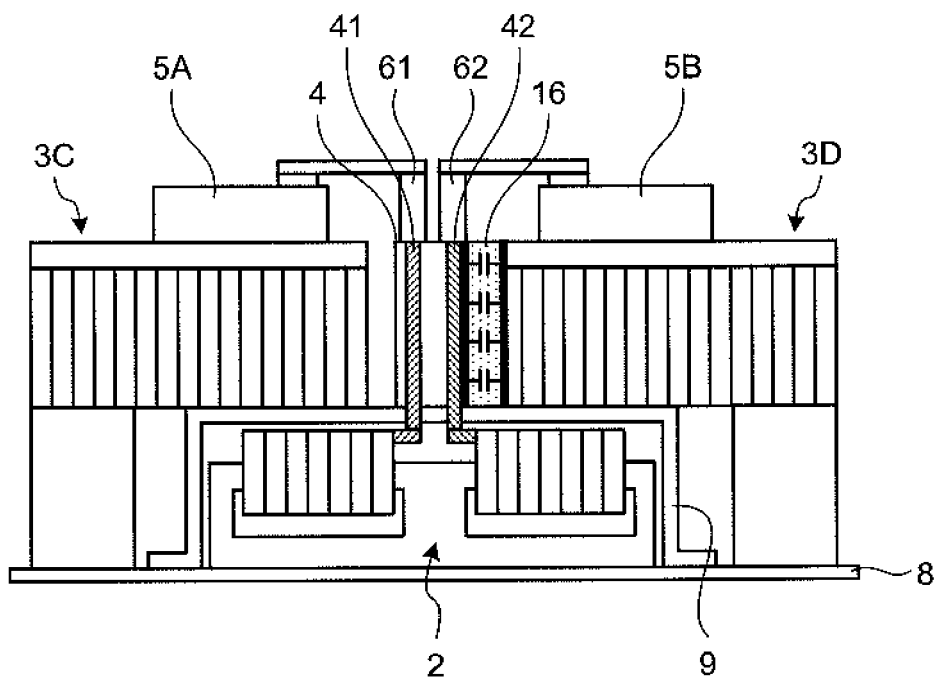
FIG. 17 is a diagram of a configuration example of a power conversion apparatus according to a fourth embodiment that enables a further increase in the stray capacitance.

In the third embodiment, the embodiment in which the stray capacitance between the inverter module and the cooling fin is larger than the stray capacitance between the rectifying module and the cooling fin is explained. A fourth embodiment is an embodiment in which the stray capacitance is increased. This embodiment is explained with reference to FIG. 17. FIG. 17 is a diagram of an example in which the stray capacitance formed in the third embodiment is further increased.

In a power conversion apparatus according to the fourth embodiment, in the configuration shown in FIG. 14 in which the DCL 2 is connected to only the P-side terminal between the rectifying module 5A and the inverter module 5B, a dielectric 16 is inserted between the cooling fin 3D mounted with the inverter module 5B and the P-side output conductor 42 of the terminal block 4. The dielectric 16 can be formed integrally with the terminal block 4 or can be formed integrally with the cooling fin 3D. When a DCL is connected to the N-side terminal between the rectifying module 5A and the inverter module 5B as well, a dielectric only has to be inserted not only between the cooling fin 3D and the P-side output conductor 42 but also between the cooling fin 3D and the N-side output conductor 44.

With the power conversion apparatus according to the fourth embodiment, it is possible to improve the filter effect by the LC filter according to the further increase of the stray capacitance and improve the effect of blocking outflow of a high-frequency current to a system power supply side.

Fifth Embodiment

As the devices used in the power conversion apparatuses according to the first to fourth embodiments, in general, a semiconductor transistor device (an IGBT, a MOSFET, etc.) including Si (silicon) as a material and a semiconductor diode device also including Si as a material are used.

Figure 18:
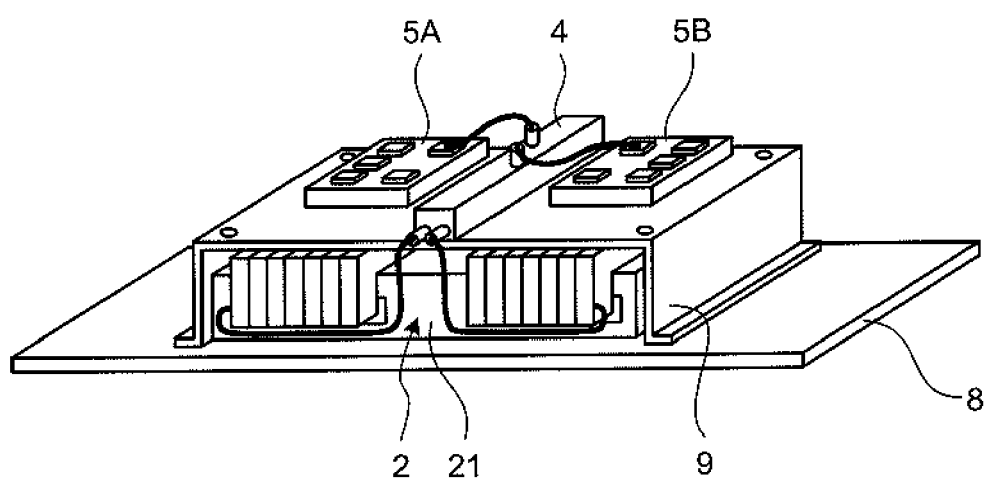
FIG. 18 is a perspective view of a configuration example of a power conversion apparatus according to a fifth embodiment in which an SiC device is used.
Figure 19:
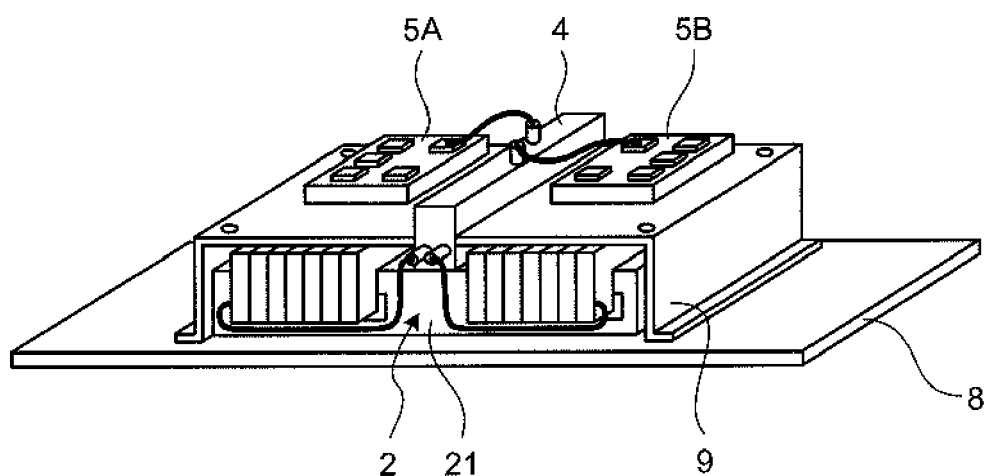
FIG. 19 is a perspective view of another configuration example of a terminal block in the configuration shown in FIG. 18.
Figure 20:
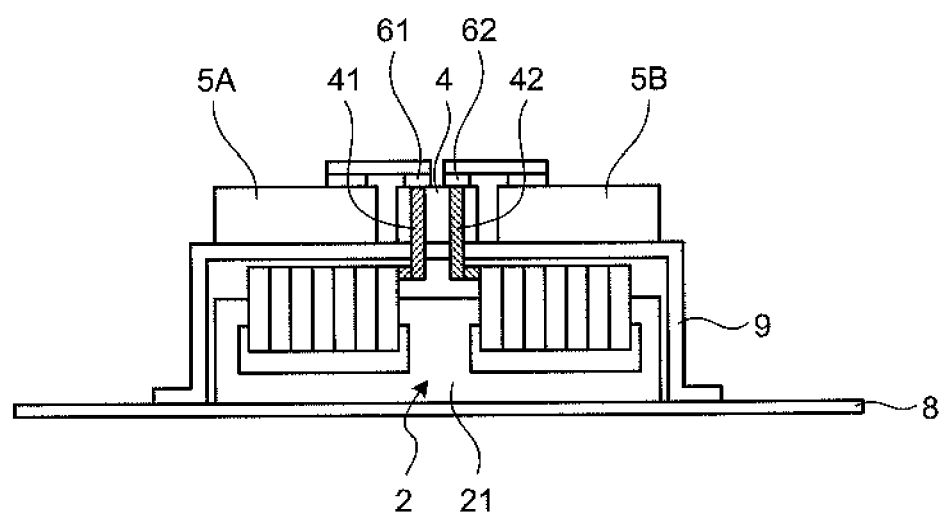
FIG. 20 is a front view including a partial sectional view of the power conversion apparatus in the configuration shown in FIG. 19.

On the other hand, the power conversion apparatuses according to the first to fourth embodiments are not limited to a switching device formed using Si as a material. Naturally, it is also possible to use a semiconductor transistor device and a semiconductor diode device including SiC (silicon carbide), which attracts attention in recent years, as a material instead of Si. Therefore, in a fifth embodiment, a power conversion apparatus configured using an SiC device is explained with reference to FIGS. 18 to 20. FIG. 18 is a perspective view of a configuration example of the power conversion apparatus according to the fifth embodiment in which the SiC device is used. FIG. 19 is a perspective view showing another configuration example of a terminal block in the configuration shown in FIG. 18. FIG. 20 is a front view including a partial sectional view of the power conversion apparatus in the configuration shown in FIG. 19.

The SiC device can operate at high temperature compared with the Si device in the past. Therefore, it is possible to make the cooling fan for the power conversion module unnecessary and mount a power conversion module configured by the SiC device in the vicinity of a direct-current reactor heated to high temperature. With such a characteristic, in the power conversion apparatus according to the fifth embodiment, the rectifying module 5A and the inverter module 5B are mounted on the upper surface of the DCL fixing member 9. As in the first to fourth embodiments, the DCL 2 is arranged in the lower part (the lower layer) of the rectifying module 5A and the inverter module 5B. According to these configurations, in the power conversion apparatus according to the fifth embodiment, it is possible to reduce the dimension in the height direction (reduce the height) compared with the power conversion apparatuses according to the first to fourth embodiments.

As shown in FIG. 18, the terminal block 4 can be set in an upper part of the DCL fixing member 9 between the rectifying module 5A and the inverter module 5B. Alternatively, as shown in FIGS. 19 and 20, an air gap can be provided in the DCL fixing member 9 and the terminal block 4 can be set in an upper part of the DCL core 21 to pierce through the air gap.

As explained above, with the power conversion apparatus according to the fifth embodiment, a wide band gap semiconductor is used as the device mounted on the rectifying module and the inverter module. Therefore, it is possible to make the cooling fin unnecessary and further reduce the size (in particular, reduce the height) of the power conversion apparatus.

With the power conversion apparatus according to the fifth embodiment, the rectifying module and the inverter module are mounted on the upper part of the fixing member that fixes the direct-current reactor to cover the upper part of the direct-current reactor and at least a part of the peripheral section. The terminal block for obtaining electrical connection between the rectifying module and the direct-current reactor and electrical connection between the inverter module and the direct-current reactor is arranged making use of the space formed by the upper part of the fixing member, the rectifying module, and the inverter module. Therefore, even when the DCL is mounted on the power conversion apparatus, it is possible to suppress an increase in a mounting area and costs.

SiC is an example of a semiconductor called wide band gap semiconductor that has a characteristic that a band gap is larger than the band gap of Si. Apart from this SiC, a semiconductor formed using a gallium nitride material or diamond also belongs to the wide band gap semiconductor. Many characteristics of the semiconductor are similar to the characteristics of SiC. Therefore, configurations in which other wide band gap semiconductors other than SiC are used also form the gist of this embodiment.

A transistor device and a diode device formed by such a wide band gap semiconductor has high voltage resistance and high allowable current density. Therefore, it is possible to reduce the size of the transistor device and the diode device. By using the transistor device and the diode device reduced in size, it is possible to reduce the size of the power conversion module incorporating the devices.

Further, the transistor device and the diode device formed by the wide band gap semiconductor have a small power loss. Therefore, it is possible to improve the efficiency of the switching device and the diode device and improve the efficiency of the power conversion module.

Sixth Embodiment

In the power conversion apparatuses according to the second to fourth embodiments, the configuration in which the reducing effect for higher harmonics and high-frequency noise by the LC filter (the noise filter) including the stray capacitance, which is formed making use of the thickness in the height direction of the cooling fin, and the DCL is explained. On the other hand, the power conversion apparatus according to the fifth embodiment has the configuration in which the cooling fin for the power conversion module can be omitted by using the SiC device as the device of the power conversion module. Therefore, the power conversion apparatuses have the structure in which the thickness in the height direction in the cooling fin is insufficient and it is difficult to form the stray capacitance. Therefore, in a power conversion apparatus according to a sixth embodiment, the shape of the P-side output conductor in the terminal block is changed to a shape in which required stray capacitance is formed.

Figure 21:
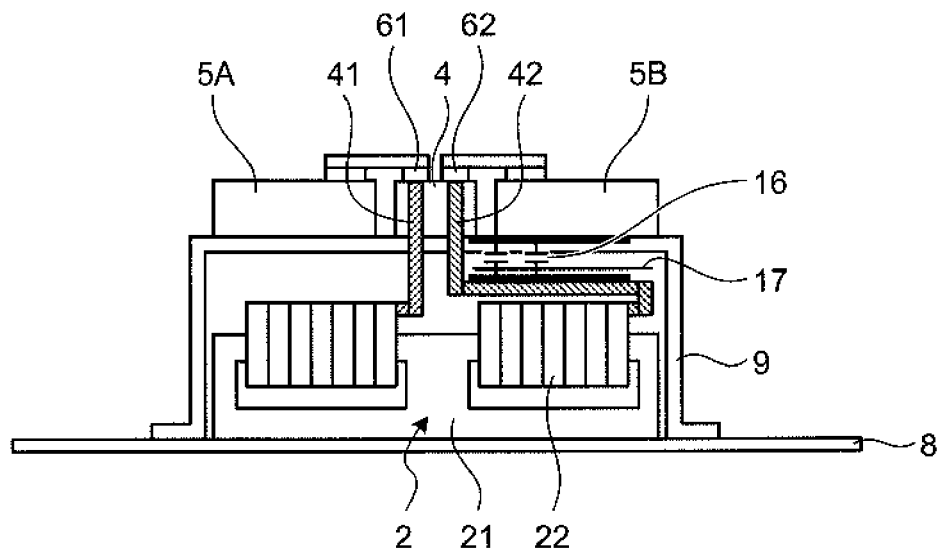
FIG. 21 is a front view including a partial perspective view of a configuration example of a power conversion apparatus according to a sixth embodiment.

FIG. 21 is a front view including a partial sectional view of a configuration example of the power conversion apparatus according to the sixth embodiment. In the sixth embodiment, in the power conversion apparatus according to the fifth embodiment shown in FIG. 20, the dimension in the height direction of the DCL fixing member 9 is increased and the P-side output conductor 42 extending in parallel to a power conversion module mounting surface (a horizontal surface) of the DCL fixing member 9 is provided on the lower surface of the DCL fixing member 9 (specifically, a space formed by the DCL fixing member 9 and the winding section 22 of the DCL 2). That is, the P-side output conductor 42 in the sixth embodiment includes a vertical conductor projecting from the lower end of the terminal block 4 and piercing through the DCL fixing member 9 and a horizontal conductor arranged in parallel to the power conversion module mounting surface of the DCL fixing member 9 present on the inverter module 5B side. The DCL fixing member 9 is a nonmagnetic conductor and connected to the FG together with the bottom plate 8.

With the configuration explained above, stray capacitance shown in FIG. 21 is formed between the horizontal conductor of the P-side output conductor 42 and the horizontal surface of the DCL fixing member 9 present on the inverter module 5B side.

As explained above, in the power conversion apparatus according to the sixth embodiment, the P-side output conductor arranged in parallel to the device mounting surface of the DCL fixing member present on the inverter module side and the device mounting surface of the DCL fixing member are opposed to each other to form the stray capacitance on the lower surface of the DCL fixing member. Therefore, it is possible to obtain an LC filter formed by the stray capacitance and an inductance component of the DCL and improve the effect of blocking outflow of a high-frequency current to a system power supply side.

The P-side output conductor 42 is a direct-current high-voltage terminal. When the distance between the P-side output conductor 42 and the DCL fixing member 9 is short and an insulation distance between the sections causes a problem, for example, insulating paper 17 having required insulation performance only has to be inserted between the sections.

Seventh Embodiment

Figure 22:
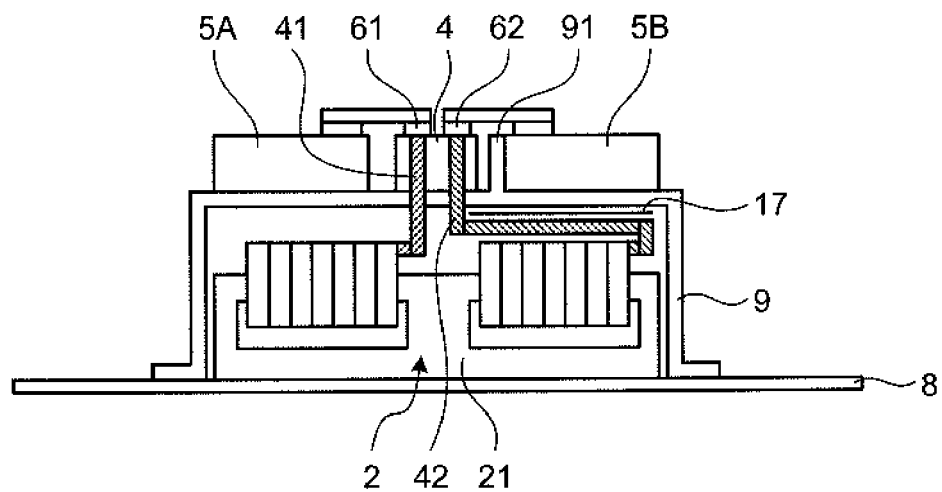
FIG. 22 is a diagram of a configuration example of a power conversion apparatus according to a seventh embodiment that enables a further increase in the stray capacitance.

In the sixth embodiment, the embodiment in which the stray capacitance is formed between the horizontal conductor of the P-side output conductor and the horizontal surface of the DCL fixing member present on the inverter module side is explained. A seventh embodiment is an embodiment in which the stray capacitance is increased. This embodiment is explained with reference to FIG. 22. FIG. 22 is a diagram of an example in which the stray capacitance formed in the sixth embodiment is further increased.

In a power conversion apparatus according to the seventh embodiment, as shown in FIG. 22, a projecting section (a first projecting section) 91 is provided on the horizontal surface of the DCL fixing member 9. The projecting section 91 is formed on a flat plate to be plane-symmetrical to the P-side output conductor 42 of the terminal block 4 and is arranged on the horizontal surface of the DCL fixing member 9 to extend in the vertical direction from between the terminal block 4 and the inverter module 5B. With this configuration, stray capacitance is formed between the projecting section 91 and the P-side output conductor 42 and added to the stray capacitance formed in the sixth embodiment. In FIG. 22, the projecting section 91 is shown to extend from the side of the side surface section of the inverter module 5B. However, the projecting section 91 is not limited to this position. The projecting section 91 can extend from any position as long as the projecting section 91 is opposed to the P-side output conductor 42 and can form stray capacitance.

As explained above, in the power conversion apparatus according to the seventh embodiment, the projecting section is provided on the horizontal surface of the DCL fixing member 9 and arranged to be plane-symmetrical to the P-side output conductor 42. Therefore, it is possible to increase the stray capacitance formed between the DCL and the inverter module. It is possible to improve the filter effect by the LC filter and improve the effect of blocking outflow of a high-frequency current to a system power supply side.

Eighth Embodiment

Figure 23:
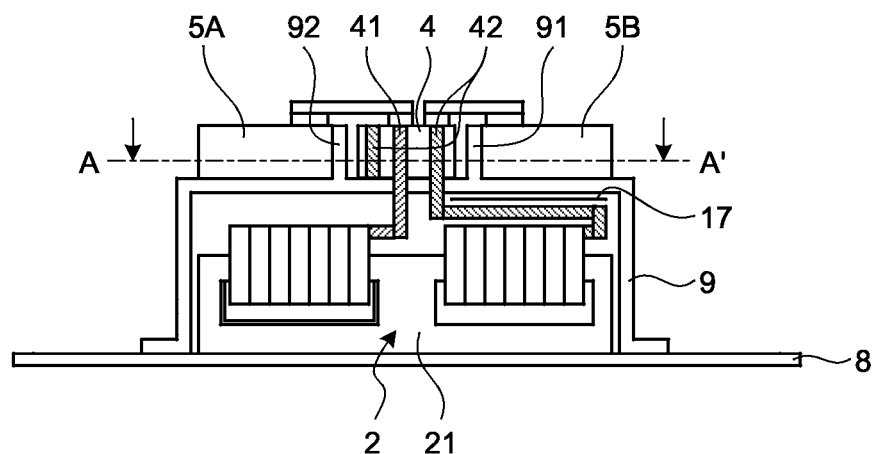
FIG. 23 is a front view including a partial sectional view of a configuration example of a power conversion apparatus according to an eighth embodiment.
Figure 24:
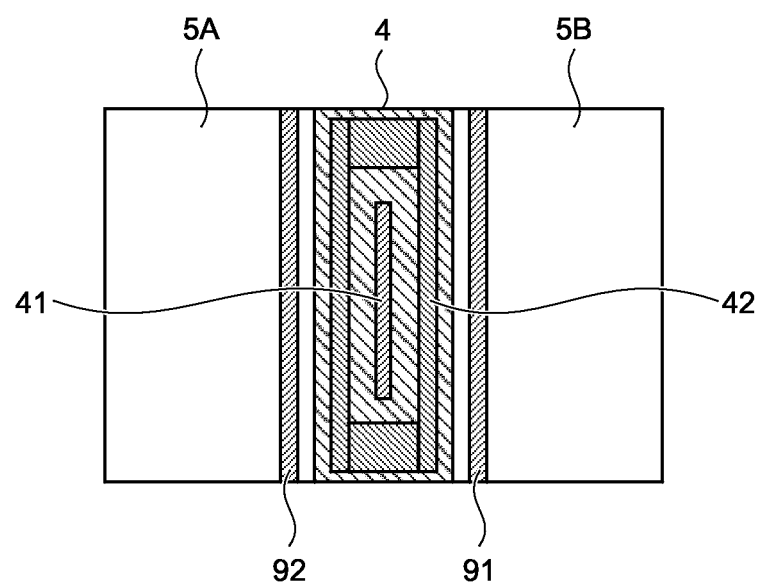
FIG. 24 is an A-A' line sectional view of a configuration example of a terminal block in the configuration shown in FIG. 23.
Figure 25:
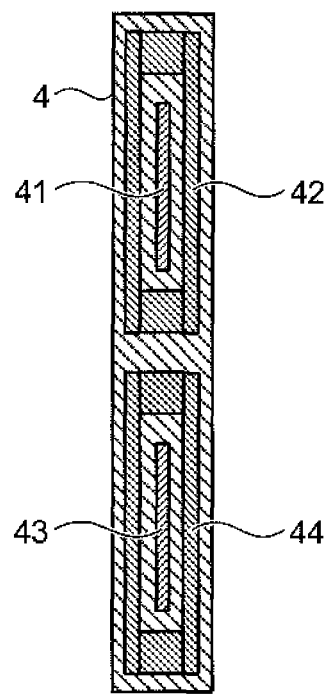
FIG. 25 is a sectional view of another configuration example of a terminal block according to the eighth embodiment.

In the seventh embodiment, the embodiment in which the stray capacitance on the P-side output conductor side is increased is explained. An eighth embodiment is an embodiment in which the stray capacitance on the P-side output conductor side is further increased. The configuration of a terminal block according to this embodiment is explained with reference to FIGS. 23 to 25. FIG. 23 is a front view including a partial sectional view of a configuration example of a power conversion apparatus according to the eighth embodiment. FIG. 24 is an A-A' line sectional view of the configuration of the terminal block in the configuration shown in FIG. 23. FIG. 25 is a sectional view of another configuration example of the terminal block according to the eighth embodiment.

In the inside of the terminal block 4 according to the eighth embodiment, the P-side input conductor 41 and the P-side output conductor 42 arranged in a rectangular annular shape to surround the P-side input conductor 41 are housed. The P-side input conductor 41 and the P-side output conductor 42 only have to be arranged apart from each other to be capable of securing a required insulation distance. In the eighth embodiment, a projecting section (a second projecting section) 92 plane-symmetrical to the P-side output conductor 42 formed in the rectangular annular shape is further provided on the side of the side surface section of the rectifying module 5A. According to these configurations, stray capacitance is formed between the P-side output conductor 42 and the projecting sections 91 and 92.

The stray capacitance formed at this point is stray capacitance formed on the output side of the DCL 2 (the inverter module 5B side) (see the equivalent circuit shown in FIG. 15). That is, in the eighth embodiment, because the P-side output conductor 42 is formed in the rectangular annular shape, the stray capacitance between the P-side output conductor 42 and the projecting section 92 arranged on the rectifying module 5A side is stray capacitance formed on the output side of the DCL 2. Therefore, with the power conversion apparatus according to the eighth embodiment, the stray capacitance applied to the output side of the DCL 2 is formed making use of a space on the input side of the DCL 2 in terms of a circuit. The eighth embodiment is considered to be an embodiment in which stray capacitance is formed effectively making use of a free space of the power conversion apparatus.

When the DCL 2 is connected to both the P-side terminal and the N-side terminal as indicated by the equivalent circuit shown in FIG. 16, as conductor arrangement on the inside of the terminal block 4, for example, the conductors only have to be housed as shown in FIG. 25. In FIG. 25, it is also possible to insert dielectrics in both places adjacent to each other while securing an insulation distance between the P-side output conductor 42 and the N-side output conductor 44. If the power conversion apparatus is configured in this way, it is possible to form stray capacitance different from the stray capacitance between the respective conductors and use the stray capacitance as a snubber capacitor.

Ninth Embodiment

Figure 26:
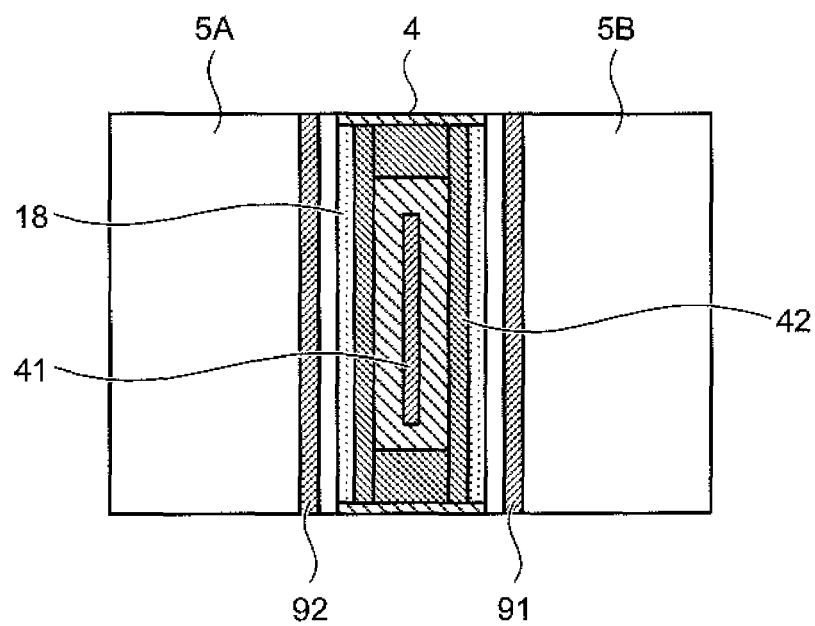
FIG. 26 is a sectional view of a configuration example of a terminal block according to a ninth embodiment that enables a further increase in the stray capacitance.

A ninth embodiment is an embodiment in which the stray capacitance formed in the eighth embodiment is further increased. The eighth embodiment is explained with reference to FIG. 26. FIG. 26 is a sectional view of a configuration example of a terminal block that enables a further increase in stray capacitance.

In a power conversion apparatus according to the ninth embodiment, in the configuration shown in FIG. 24 in which the P-side output conductor 42 is formed in the rectangular annular shape around the P-side input conductor 41, a dielectric 18 is inserted between the P-side output conductor 42 and the projecting sections 91 and 92 of the DCL fixing member 9. In FIG. 26, a configuration in which the dielectric 18 is housed in the inside of the terminal block 4 is illustrated. However, the dielectric 18 can be arranged in contact with the projecting sections 91 and 92 on the outside of the terminal block 4 or can be arranged in contact with both of the P-side output conductor 42 and the projecting sections 91 and 92.

With the power conversion apparatus according to the ninth embodiment, it is possible to improve the filter effect by the LC filter through the further increase in the stray capacitance and improve the effect of blocking outflow of a high-frequency current to a system power supply side.

The configurations explained in the first to ninth embodiments are examples of the configuration of the present invention. It goes without saying that several embodiments among the first to ninth embodiments can be combined with one another or combined with other publicly-known technologies and the embodiments can be configured to be changed, for example, a part of the embodiments can be omitted without departing from the spirit of the present invention.

INDUSTRIAL APPLICABILITY

As explained above, the power conversion apparatuses according to the embodiments are useful as an invention that can suppress an increase in a mounting surface and costs even when a DCL is mounted on the power conversion apparatuses.

REFERENCE SIGNS LIST

2 DCL (direct-current reactor)
3A, 3B cooling fins
3C cooling fin (first cooling fin)
3D cooling fin (second cooling fin)
4 terminal block
5 power conversion module
5A rectifying module
5B inverter module
8 bottom plate
9 DCL fixing member
10 air gap section
11 main circuit capacitor
12 cooling fan
14 stray capacitance
16, 18 dielectrics
17 insulating paper
21 DCL core
22 winding section
31 base section
32 vane section
34 side surface sections
41 P-side input conductor (first positive-side connection conductor)
42 P-side output conductor (second positive-side connection conductor)
43 N-side input conductor (first negative-side connection conductor)
44 N-side output conductor (second negative-side connection conductor)
51, 52 P-side terminals
53, 54 N-side terminals
61 to 68 terminals
91 projecting section (first projecting section)
92 projecting section (second projecting section)

The invention claimed is:

1. A power conversion apparatus comprising: a power conversion module mounted with a power conversion device; a direct-current reactor; and a cooling fin configured to cool the power conversion module, wherein
the power conversion module is mounted on a base section of the cooling fin,
the direct-current reactor is arranged in a lower layer of a vane section attached to a lower surface of the base section of the cooling fin, and
an air gap section is provided in the cooling fin, and a terminal block for obtaining electrical connection between the power conversion module and the direct-current reactor is arranged making use of a space of the air gap section.

2. The power conversion apparatus according to claim 1, wherein a connection conductor for obtaining electrical connection to the direct-current reactor is formed in an inside of the terminal block, and the connection conductor and a side surface of the cooling fin adjacent to the connection conductor in the air gap section are opposed to each other to form stray capacitance.

3. The power conversion apparatus according to claim 2, wherein a dielectric is inserted between the connection conductor and the side surface of the cooling fin.

4. The power conversion apparatus according to claim 2, wherein
the connection conductor includes a positive-side connection conductor connected to a high-voltage side terminal of the power conversion module and a negative-side connection conductor connected to a low-voltage side terminal of the power conversion module, and
a dielectric is inserted between the positive-side connection conductor and the negative-side connection conductor.

5. The power conversion apparatus according to claim 1, wherein a fixing member configured to fix the direct-current reactor is provided to cover an upper part of the direct-current reactor and at least a part of a peripheral section, and the terminal block is arranged in an upper part of the fixing member.

6. The power conversion apparatus according to claim 1, wherein the power conversion module includes a rectifying module and an inverter module, and the rectifying module and the inverter module are respectively mounted on base sections of separate cooling fins, a fixing member configured to fix the direct-current reactor is provided to cover an upper part of the direct-current reactor and at least a part of a peripheral section, the air gap section is formed in a space formed by an upper part of the fixing member, a cooling fin for the rectifying module, and a cooling fin for the inverter module, and the terminal block is arranged in an upper part of the fixing member.

7. The power conversion apparatus according to claim 6, wherein connection conductors for obtaining electrical connection to the direct-current reactor are formed in an inside of the terminal block, and a connection conductor for obtaining electrical connection between the inverter module and the direct-current reactor of the connection conductors and a side surface of the cooling fin for the inverter module are opposed to each other to form stray capacitance.

8. The power conversion apparatus according to claim 7, wherein a dielectric is inserted between the connection conductor and the side surface of the cooling fin for the inverter module.

9. The power conversion apparatus according to claim 6, wherein the direct-current reactor is connected between high-pressure side terminals and between low-voltage side terminals of the rectifying module and the inverter module.

10. The power conversion apparatus according to claim 9, wherein connection conductors for obtaining electrical connection to the direct-current reactor are formed in an inside of the terminal block, and a connection conductor for obtaining electrical connection between the rectifying module and the direct-current reactor of the connection conductors and a side surface of the cooling fin for the rectifying module are opposed to each other to form stray capacitance, and a connection conductor for obtaining electrical connection between the inverter module and the direct-current reactor of the connection conductors and a side surface of the cooling fin for the inverter module are opposed to each other to form stray capacitance.

11. The power conversion apparatus according to claim 10, wherein the connection conductors include a first positive-side connection conductor connected to a high-voltage side terminal of the rectifying module, a first negative-side connection conductor connected to a low-voltage side terminal of the rectifying module, a second positive-side connection conductor connected to a high-voltage side terminal of the inverter module, and a second negative-side connection conductor connected to a low-voltage side terminal of the inverter module, and dielectrics are inserted respectively between the first positive-side connection conductor and the first negative-side connection conductor and between the second positive-side connection conductor and the second negative-side connection conductor.

12. A power conversion apparatus comprising: a rectifying module mounted with a power conversion device; an inverter module; and a direct-current reactor, wherein a fixing member configured to fix the direct-current reactor is provided to cover an upper part of the direct-current reactor and at least a part of a peripheral section, the rectifying module and the inverter module are configured using a wide band gap semiconductor and mounted on an upper part of the fixing member, a terminal block for obtaining electrical connection between the rectifying module and the direct-current reactor and electrical connection between the inverter module and the direct-current reactor is provided, and the terminal block is arranged making use of a space formed by the upper part of the fixing member, the rectifying module, and the inverter module.

13. The power conversion apparatus according to claim 12, wherein connection conductors for obtaining electrical connection to the direct-current reactor are formed in an inside of the terminal block, the connection conductors include a first positive-side connection conductor connected to a high-voltage side terminal of the rectifying module and a second positive-side connection conductor connected to a high-voltage side terminal of the inverter module, the second positive-side connection conductor includes a vertical conductor projecting from a lower end of the terminal block and piercing through the fixing member and a horizontal conductor arranged in parallel to a device mounting surface of the fixing member present on the inverter module side on a lower surface of the fixing member, and the horizontal conductor is opposed to the device mounting surface of the fixing member to form stray capacitance.

14. The power conversion apparatus according to claim 13, wherein insulating paper is inserted between the device mounting surface of the fixing member and the horizontal conductor.

15. The power conversion apparatus according to claim 12, wherein a projecting section formed in a flat plate shape and extending in a vertical direction from between the terminal block and the inverter module is provided in the fixing member, and the projecting section is opposed to the vertical conductor of the second positive-side connection conductor to form stray capacitance.

16. The power conversion apparatus according to claim 12, wherein connection conductors for obtaining electrical connection to the direct-current reactor are formed in an inside of the terminal block, the connection conductors include a first positive-side connection conductor connected to a high-voltage side terminal of the rectifying module and a second positive-side connection conductor connected to a high-voltage side terminal of the inverter module, the second positive-side connection conductor includes a vertical conductor projecting from a lower end of the terminal block and piercing through the fixing member and a horizontal conductor arranged in parallel to a device mounting surface of the fixing member present on the inverter module side on a lower surface of the fixing member, a first projecting section formed in a flat plate shape and extending in a vertical direction from between the terminal block and the inverter module and a second projecting section formed in a flat plate shape and extending in the vertical direction from between the terminal block and the rectifying module are provided in the fixing member, a part of the vertical conductor is formed in a rectangular annular shape to surround the first positive-side connection conductor, and the horizontal conductor is opposed to the devise mounting surface of the fixing member to form stray capacitance and a part of the vertical conductor is opposed to the first and second projecting sections to form stray capacitance.

17. The power conversion apparatus according to claim 16, wherein dielectrics are inserted between a part of the vertical conductor of the second positive-side connection conductor and the first projecting section and between a part of the vertical conductor of the second positive-side connection conductor and the second projecting section.

18. The power conversion apparatus according to claim 12, wherein connection conductors for obtaining electrical connection to the direct-current reactor are formed in an inside of the terminal block, the connection conductors include a first positive-side connection conductor connected to a high-voltage side terminal of the rectifying module, a first negative-side connection conductor connected to a low-voltage side terminal of the rectifying module, a second positive-side connection conductor connected to a high-voltage side terminal of the inverter module, and a second negative-side connection conductor connected to a low-voltage side terminal of the inverter module, the second positive-side connection conductor includes a vertical conductor projecting from a lower end of the terminal block and piercing through the fixing member and a horizontal conductor arranged in parallel to a device mounting surface of the fixing member present on the inverter module side on a lower surface of the fixing member, the second negative-side connection conductor includes a vertical conductor projecting from a lower end of the terminal block and piercing through the fixing member and a horizontal conductor arranged in parallel to the device mounting surface of the fixing member present on the inverter module side on the lower surface of the fixing member, a first projecting section formed in a flat plate shape and extending in a vertical direction from between the terminal block and the inverter module and a second projecting section formed in a flat plate shape and extending in the vertical direction from between the terminal block and the rectifying module are provided in the fixing member, a part of the vertical conductor of the second positive-side connection conductor is formed in a rectangular annular shape to surround the first positive-side connection conductor, a part of the vertical conductor of the second negative-side connection conductor is formed in a rectangular annular shape to surround the first negative-side connection conductor, the horizontal conductor of the second positive-side connection conductor is opposed to the device mounting surface of the fixing member to form stray capacitance and a part of the vertical conductor of the second positive-side connection conductor is opposed to the first and second projecting sections to form stray capacitance, and a part of the vertical conductor of the second negative-side connection conductor is opposed to the first and second projecting sections to form stray capacitance.

19. The power conversion apparatus according to claim 18, wherein dielectrics are inserted between a part of the vertical conductor of the second positive-side connection conductor and the first projecting section and between a part of the vertical conductor of the second positive-side connection conductor and the second projecting section, and dielectrics are inserted between a part of the vertical conductor of the second negative side connection conductor and the first projecting section and between a part of the vertical conductor of the second negative-side connection conductor and the second projecting section.

20. The power conversion apparatus according to claim 12, wherein the wide band gap semiconductor is a semiconductor formed using silicon carbide, a gallium nitride material, or diamond.

* * * * *